US011569235B2

United States Patent
Wang et al.

(10) Patent No.: US 11,569,235 B2
(45) Date of Patent: Jan. 31, 2023

(54) SEMICONDUCTOR DEVICE AND METHOD OF MANUFACTURING THE SAME

(71) Applicant: UNITED MICROELECTRONICS CORP., Hsin-Chu (TW)

(72) Inventors: Chih-Yi Wang, Tainan (TW); Tien-Shan Hsu, Tainan (TW); Cheng-Pu Chiu, New Taipei (TW); Yao-Jhan Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 112 days.

(21) Appl. No.: 17/075,729

(22) Filed: Oct. 21, 2020

(65) Prior Publication Data

US 2021/0035977 A1 Feb. 4, 2021

Related U.S. Application Data

(62) Division of application No. 16/251,053, filed on Jan. 17, 2019, now Pat. No. 10,868,011.

(30) Foreign Application Priority Data

Dec. 19, 2018 (CN) ........................ 201811557549.5

(51) Int. Cl.

| | |
|---|---|
| ***H01L 21/308*** | (2006.01) |
| ***H01L 27/092*** | (2006.01) |
| ***H01L 29/78*** | (2006.01) |
| ***H01L 29/06*** | (2006.01) |
| ***H01L 29/66*** | (2006.01) |
| ***H01L 21/8238*** | (2006.01) |
| ***H01L 29/161*** | (2006.01) |
| ***H01L 29/26*** | (2006.01) |

(52) U.S. Cl.

CPC ...... *H01L 27/0924* (2013.01); *H01L 21/3086* (2013.01); *H01L 21/823807* (2013.01); *H01L 21/823821* (2013.01); *H01L 21/823878* (2013.01); *H01L 29/0649* (2013.01); *H01L 29/161* (2013.01); *H01L 29/26* (2013.01); *H01L 29/66795* (2013.01); *H01L 29/7851* (2013.01)

(58) Field of Classification Search

CPC ............. H01L 27/0924; H01L 29/0649; H01L 29/161; H01L 29/26; H01L 29/66795; H01L 29/7851; H01L 21/3086; H01L 21/823807

See application file for complete search history.

(56) References Cited

U.S. PATENT DOCUMENTS 9,601,575 B2 3/2017 Jung
9,786,665 B1 * 10/2017 Pendharkar ..... H01L 21/823892

(Continued)

*Primary Examiner* — Nathan W Ha
(74) *Attorney, Agent, or Firm* — Winston Hsu

(57) ABSTRACT

A semiconductor device is provided in the disclosure, including a substrate, multiple parallel fins protruding from the substrate and isolated by trenches, and a device insulating layer on the trenches between two fins, wherein the trench is provided with a central first trench and two second trenches at both sides of the first trench, and a depth of the first trench is deeper than a depth of the second trench, and the device insulating layer is provided with a top plane, a first trench and a second trench, and the fins protrude from the top plane, and the bottom surface of the second trench is lower than the bottom surface of the first trench.

9 Claims, 3 Drawing Sheets

120 108c 108b 122 114 124 104a 100 104b 108 130 128 126 101 102 101 D2

(56) References Cited

U.S. PATENT DOCUMENTS 9,960,084 B1 5/2018 Ye
10,147,728 B1 * 12/2018 Chang ............... H01L 21/76224
10,541,205 B1 * 1/2020 Cheng ................ H01L 21/4853
10,658,463 B2 5/2020 Jung
2008/0146000 A1 * 6/2008 Lee .................. H01L 21/76232 257/E21.549
2011/0115047 A1 * 5/2011 Hebert ............. H01L 29/66272 257/E29.174
2013/0034949 A1 * 2/2013 Kao ..................... H01L 21/308 257/E21.548
2013/0217220 A1 8/2013 Jagannathan
2016/0099181 A1 4/2016 Tung
2016/0190131 A1 6/2016 You
2016/0225906 A1 * 8/2016 Wang ............. H01L 21/823821
2016/0329328 A1 11/2016 Moon
2017/0103985 A1 4/2017 Kim
2017/0133264 A1 * 5/2017 Kim ................... H01L 27/1104
2017/0352663 A1 12/2017 Zhou
2018/0108661 A1 4/2018 Guo
2018/0138174 A1 5/2018 Min
2018/0145072 A1 * 5/2018 Kim ................... H01L 29/0649
2018/0261508 A1 9/2018 Zhou
2018/0350904 A1 * 12/2018 Nagai .............. H01L 21/76229
2019/0067277 A1 2/2019 Tsai
2019/0097053 A1 3/2019 Cheng
2019/0148373 A1 5/2019 Shi
2019/0312034 A1 10/2019 Lee
2019/0355720 A1 11/2019 Deng
2019/0393220 A1 12/2019 Na

* cited by examiner

SEMICONDUCTOR DEVICE AND METHOD OF MANUFACTURING THE SAME

CROSS REFERENCE TO RELATED APPLICATIONS

This application is a divisional application of U.S. application Ser. No. 16/251,053 filed on Jan. 17, 2019, and incorporated herein by reference in its entirety.

BACKGROUND OF THE INVENTION

1. Field of the Invention

The present invention generally relates to a semiconductor structure, and more specifically, to a semiconductor structure with particular device insulating layers and method of forming the same.

2. Description of the Prior Art

Current Metal-Oxide-Semiconductor Field-Effect Transistor (MOSFET) is a field-effect transistor widely used in analogue electronics and digital electronics with advantages of available area, operating speed, power consumption, and manufacturing cost better than conventional Bipolar Junction Transistor (BJT), therefore, are widely adopted by the industry. Complementary Metal-Oxide-Semiconductor MOS (CMOS) technology is to manufacture n-type MOSFET (NMOS) and p-type MOSFET devices concurrently on a Si-based substrate. Since NMOS and PMOS are complementary in their physical characteristics, thus it is referred to as CMOS. CMOS process may be used to manufacture static random-access memory (SRAM), micro controller unit (MCU), microprocessor and other digital logic circuit system for electronic product. In addition, due to its technical characteristics, it may be used in the manufacture of optical instruments. For example, CMOS image sensor (CIS) is common in some high-end digital camera.

As the advances of MOSFET technology, the length of gate is shrunk to below 20 nm. The problem of current leakage is increasingly serious since the source and drain are getting too close together. The shrinking of gate length also reduces the contact area of gate and channel, thereby weakening the influence of the gate to the channel. In order to solve this problem, the industry develops 3D Fin Field-Effect Transistors (FinFET) featuring the fin design to increase the contact area of gate and channel. The aforementioned problem is, therefore, solved.

SUMMARY OF THE INVENTION

The present invention is to provide a Fin field effect transistor (FinFET) with particular device insulating layer, wherein the device insulating layer is provided with particular recess features.

One purpose of the present invention is to provide a semiconductor structure, including a substrate, multiple parallel fins protruding from the substrate and isolated by trenches, and a device insulating layer on the trench between two fins, wherein the trench is provided with a central first trench and two second trenches at two sides of the first trench, and a depth of the first trench is lower than a depth of the second trench, and the device insulating layer is provided with a top plane, a first recess and a second recess, and the fins protrude from the top plane, and a bottom surface of the second recess is lower than a bottom surface of the first recess.

Another purpose of the present invention is to provide a method of manufacturing a semiconductor structure, including steps of providing a substrate with a first region and a second region defined thereon, and multiple parallel fins protrude from the substrate, and a device insulating layer is provided between the fins, covering a photoresist on the first region of the substrate and performing a first etch process to form first recesses in the device insulating layer, and covering another photoresist on the second region of the substrate and performing a second etch process to form second recesses in the device insulating layer, wherein a bottom surface of the second recess is lower than a bottom surface of the first recess.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
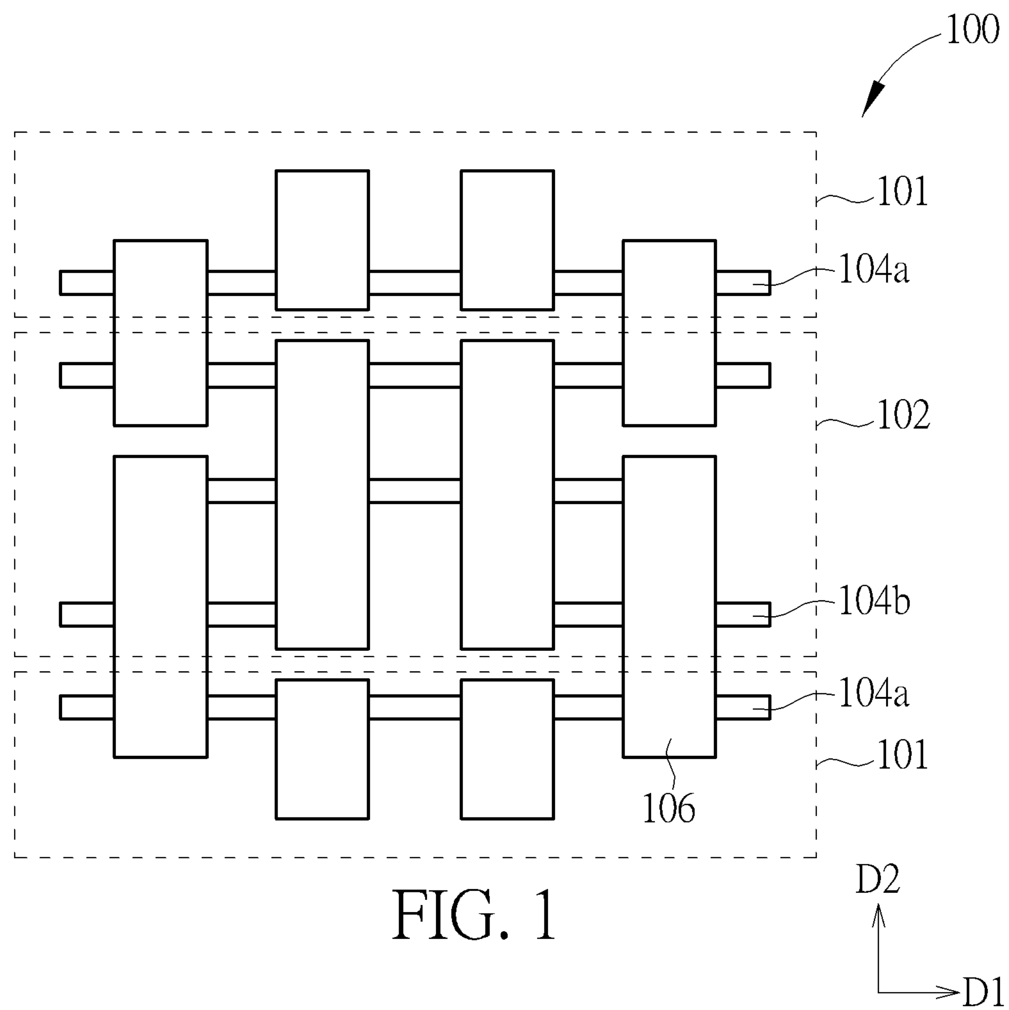
FIG. 1 is a schematic plan view of a semiconductor structure in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical and electrical changes may be made without departing from the scope of the present invention. The following detailed description is, therefore, not to be taken in a limiting sense, and the scope of the present invention is defined only by the appended claims, along with the full scope of equivalents to which such claims are entitled.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Before describing the preferred embodiment, the following description will be given for specific terms used throughout the specification. The term "etch" or "etching" is used herein to generally describe a fabrication process of patterning a material, such that at least a portion of the material remains after the etch is completed. It should be understood that the process of etching silicon involves the steps of patterning a photoresist layer above the silicon, and then removing the areas of silicon no longer protected by the photoresist layer. As such, the areas of silicon protected by the photoresist layer would remain behind after the etch process is complete. However, in another example, etching may also refer to a process that does not use a photoresist layer, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

As used herein, the term "substrate" refers to a material onto which subsequent material layers are added. The substrate itself can be patterned. Materials added on top of the substrate can be patterned or can remain unpatterned. The "substrate", "semiconductor substrate" or "wafer" referred in the disclosure is usually silicon substrate or silicon wafer. However, the substrate can include a wide array of semiconductor materials, such as silicon, germanium, gallium arsenide, indium phosphide, etc. Alternatively, the "substrate" or "wafer" may be made from an electrically non-conductive material, such as a glass, a plastic, or a sapphire wafer.

Please refer to FIG. 1, which is a schematic plan view of a semiconductor device according to one preferred embodiment of the present invention. First, provide a substrate 100, such as silicon substrate, to serve as the base of entire semiconductor structure. First regions 101 and second regions 102, such as adjacent n-type channel (NMOS) active regions and p-type channel (PMOS) active regions with different semiconductor characteristics, are defined beforehand on the substrate 100. In the embodiment, the first region 101 and the second region 102 may be defined by the method of ion doping in the substrate 100 to form wells. For example, dope a p-type substrate with n-type dopants, such as phosphorus (P) or Arsenic (As), to define different semiconductor regions on the substrate.

Furthermore, multiple parallel fins are formed on the substrate 100. Those fins protrude upwardly from the surface of the substrate 100 and extend in a first direction D1. A first region 101 and a second region 102 include a plurality of fins, for example, a plurality of p-type doped fins 104*a* or a plurality of n-type doped fins 104*b*, respectively. Fins 104*a*, 104*b* may be formed by performing photolithographic and etch processes to the substrate 100. A plurality of gates 106 are further formed on the substrate 100. The gates 106 extend in a second direction D2 and traverse across multiple fins 104*a* and 104*b*, wherein the second direction D2 is preferably perpendicular to the first direction D1. The gates 106 may be formed by first forming a material layer, such as a poly-silicon layer, on the substrate 100 and fins 104*a*, 104*b* and then performing photolithographic and etch processes to pattern the material layer. A gate dielectric layer (not shown) may be further formed between the gates 106 and the fins 104*a*, 104*b* to isolate the gates 106 and the fins 104*a*, 104*b*.

Figure 2:
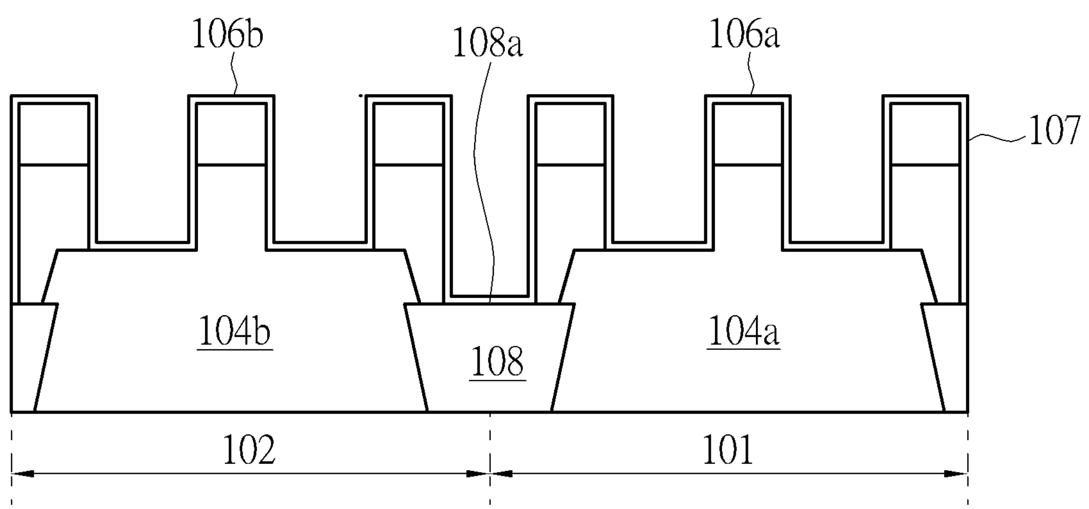
FIG. 2 to FIG. 5 are schematic cross-sections in the longitudinal direction of fins to illustrate the process flow of manufacturing the semiconductor structure in accordance with the preferred embodiment of the present invention.

Please refer now to FIG. 2, which is a schematic cross-section of a semiconductor structure in the longitudinal directions of a p-type doped fin 104*a* or a n-type doped fin 104*b* on the first region 101 and the second region 102 according to the preferred embodiment of the present invention. As shown in FIG. 2, a device insulating layer 108, such as a silicon oxide layer, is formed between the p-type doped fin 104*a* and n-type doped fin 104*b* to insulate these two different fins. The device insulating layer 108 has a top plane 108*a* from which fins 104*a* and 104*b* protrude. Multiple gates are disposed on the fins 104*a* and 104*b*, thereby constituting the field effect transistor structures, ex. n-type channel FET (NMOS) 106*a* and *p*-type channel FET (PMOS) 106*b*. A conformal layer 107, such as a silicon nitride layer, is further formed on the transistors 106*a* and 106*b* to cover the sidewalls of the gate structure and may form spacers in later process.

Figure 3:
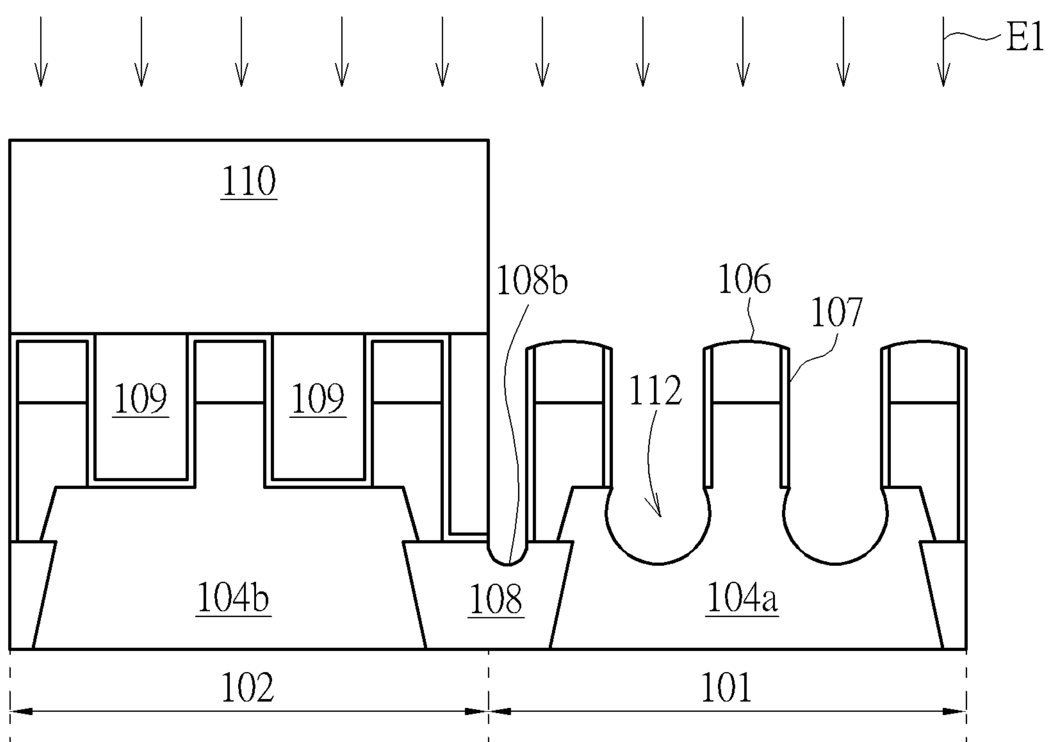

Next, refer to FIG. 3. As shown in FIG. 3, in order to form source and drain at two sides of the gate structure, a photolithographic process is first performed to cover a patterned photoresist 110 on the second region 102 (ex. PMOS region) of the substrate. An etch process E1, such as an anisotropic etch process, is then performed using the photoresist 110 and the gates 106 as an etch mask to etch exposed fins, so as to form recesses 112 on the fins at two sides of the gate 106 in the first region (NMOS region) 101. The etch process E1 may also transform the conformal layer 107 on the gate 106 into the spacers at two sides of the gate. In order to provide flat coating surface, a planarized dielectric layer 109 may be formed in advance on the gates 106 in the second region 102 before forming the patterned photoresist 110. In addition to the fins, please note that in the embodiment of the present invention, the etch process E1 would concurrently etch the exposed device insulating layer 108 at the boundary of the two regions 101, 102 to form a first recess 108*b* thereon. One side of the first recess 108*b* connects the top plane 108*a* since the gate 106 is used as a part of the etch mask.

Figure 4:
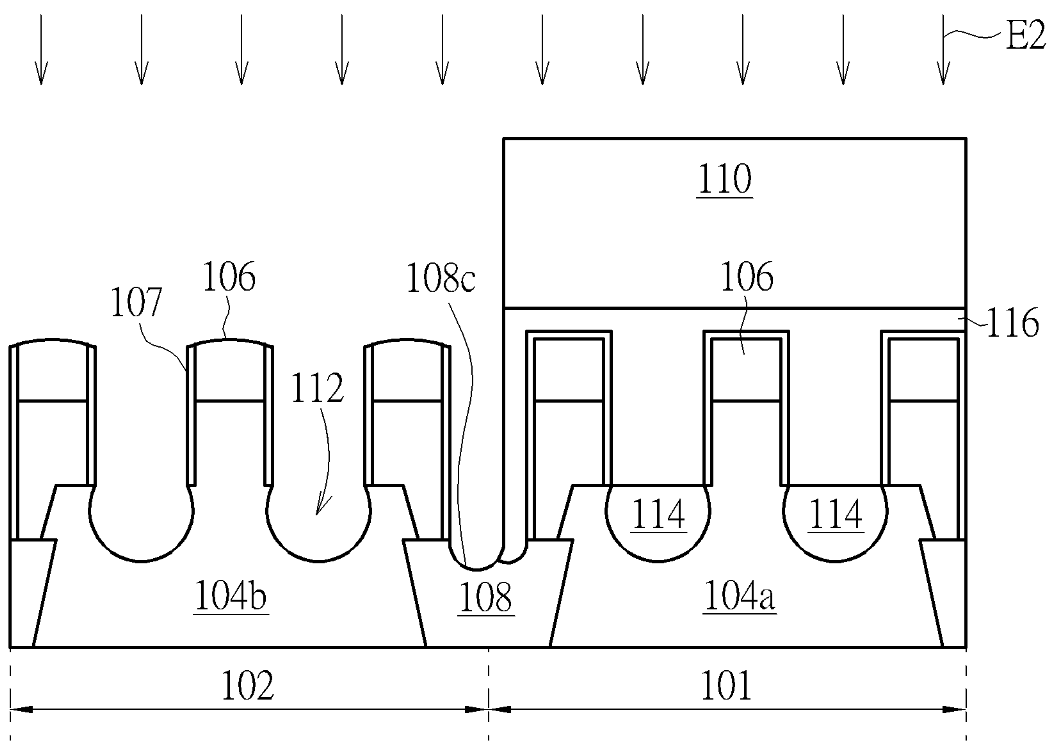

Next, please refer to FIG. 4. After the recess 112 is formed on the fins 104*a*, an epitaxial process is then performed to grow epitaxial structures 114 as source and drain of the transistor in the recesses 112 of the first region 101. Take n-type channel FET (NMOS) for example, the material of the epitaxial structure 114 may be silicon carbide (SiC) or silicon phosphide (SiP), which may provide stress to adjacent n-type channel to achieve strain-Si effect and improve carrier mobility of the channel. After the epitaxial structure 114 is formed, a dielectric layer 116 is formed on the gates 106 and the epitaxial structure 114 to provide flat coating surface. Subsequently, as shown in FIG. 4, in order to form source and drain at two sides of the gate structure, a photolithographic process is first performed on the dielectric layer 116 in the first region 101 (ex. NMOS region) of the substrate to form another patterned photoresist 118, another etch process E2, such as an anisotropic process, is then performed using the photoresist 118 and the gate 106 as an etch mask to etch exposed fins, thereby forming the recess 112 on the fins 104*b* at two sides of the gate 106 in the second region 102. The etch process E2 may also transform the conformal layer 107 into the spacers at two sides of the gate.

In addition to the fins, please note that in the embodiment of the present invention, the etch process E2 may concurrently etch the exposed device insulating layer 108 at the boundary of the two regions 101, 102 to form a second recess 108*c* thereon. One side of the second recess 108*c* connects the top plane 108*a* since the gate 106 is used as a part of the etch mask. The second recess 108*c* and the first recess 108*b* are adjacent and, since the etch process E2 would form larger recess 112 on the fin 104*b* in the second region 102, the bottom surface of the second recess 108*c* would be lower than the bottom surface of the first recess 108*b* formed by the etch process E1.

Figure 5:
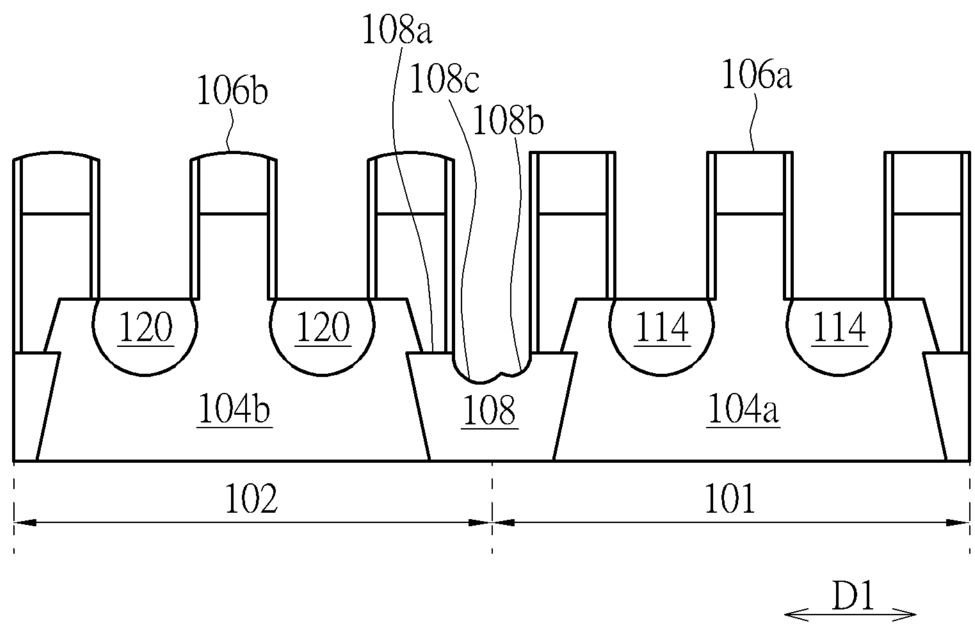

Next, please refer to FIG. 5. After the recess 112 is formed on the fin 104*b* in the second region 102, another epitaxial process is then performed to grow epitaxial structures 120 as source and drain of the transistor in the recesses 112 of the second region 102. Take p-type channel FET (PMOS) for example, the material of the epitaxial structure 120 may be silicon germanium (SiGe), which may provide stress to adjacent p-type channel to achieve strain-Si effect and improve carrier mobility of the channel. Thereafter, the dielectric layer 116 and patterned photoresist 118 on the first region 101 may be removed to form the semiconductor structure as shown in FIG. 5, which includes n-type channel FETs (NMOS) 106*a* and *p*-type channel FETs (PMOS) 106*b* respectively on the p-type doped fins 104*a* in the first region 101 and on the n-type doped fins 104*b* in the second region 102. A device insulating layer 108 is provided between the p-type doped fin 104*a* and the n-type doped fin 104*b*, including adjacent one first recess 108*b* and one second recess 108*c*. Two sides of the first recess 108*b* and the second recess 108*c* connect respectively with flat top planes 108*a* from which the fins 104*a* and 104*b* protrude, and the bottom surface of the second recess 108*c* is lower than the bottom surface of the first recess 108*b*.

Figure 6:
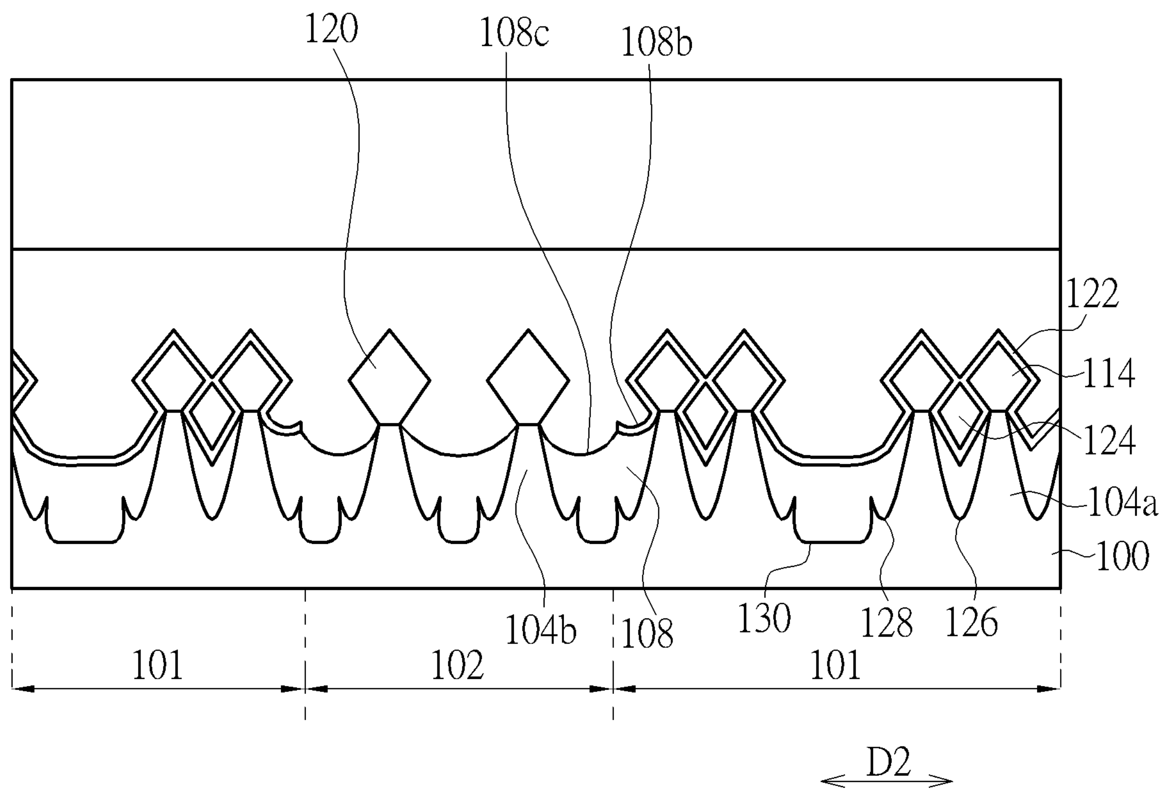
FIG. 6 is a schematic cross-section in the transverse direction of the semiconductor structure in accordance with the preferred embodiment of the present invention.

Next, please refer to FIG. 6, which is a schematic cross-section of a semiconductor structure in the transverse direction of p-type doped fins 104*a* and n-type doped fins 104*b* on the first region 101 and the second region 102 according to the preferred embodiment of the present invention. As shown in FIG. 6, epitaxial structures (ex. SiP) 114 and epitaxial structures (ex. SiGe) 120 are formed respectively on the p-type doped fins 104*a* and the n-type doped fins 104*b*, wherein the device insulating layer 108 between these two different epitaxial structures 114 and 120 may also be provided with aforementioned features, i.e. adjacent one first recess 108*b* and one second recess 108*c*, wherein the bottom surface of the second recess 108*c* is lower than the bottom surface of the first recess 108*b*. However, the device insulating layer 108 between the same epitaxial structures 114 or 120 is not provided with such two-recess feature.

In addition, please note that in the embodiment of the present invention, a conformal capping layer 122 is formed on entire surface of the substrate to cover the epitaxial structure 114 and the device insulating layer 108 on the first region 101 after the epitaxial structures 114 and 120 are formed, wherein the capping layer 122 would seal the opening between adjacent p-type doped fins 104*a* to form a void 124 therebetween. In this embodiment, the second region 102 and the epitaxial structure 120 formed thereon would not be covered by the capping layer 122.

On the other hand, in addition to the active fins 104*a* and 104*b*, as shown in FIG. 6, first trenches 126, second trenches 128 and third trenches 130 are further formed on the substrate 100. The first trench 126 and the second trench 128 are formed during the process of recessing the substrate 100 to form active fins 104*a*, 104*b*. The two trenches 126, 128 have the same depth and one side of them may be a sidewall of the fins 104*a* or 104*b*, wherein the first trench 126 is formed between the two adjacent p-type doped fins 104*a*. The third trench 130 may be formed between the two second trenches 128 by further recessing the second trench 128, so that its depth would be lower than the second trench 128 and the first trench 126. The third trench 130 may be used to separate different active blocks, wherein different active blocks may have different dopant types or doping concentrations, such as the example of a pair of active fins 104*a* between two third trenches 130 or single active fin 104*b*.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor structure, comprising:

providing a substrate, wherein a first region and a second region are defined on said substrate, and multiple parallel fins protrude from said substrate, and a device insulating layer is provided between said fins;

covering a photoresist on said first region of said substrate and performing a first etch process to form a first recess in said device insulating layer, wherein said first etch process concurrently forms source recesses and drain recesses on said fins on said first region; and covering another photoresist on said second region of said substrate and performing a second etch process to form a second recess in said device insulating layer, wherein a bottom surface of said second recess is lower than a bottom surface of said first recess, and said second etch process concurrently forms source recesses and drain recesses on said fins on said second region.

2. The method of manufacturing a semiconductor structure of claim 1, wherein said first recess and said second recess are adjacent.

3. The method of manufacturing a semiconductor structure of claim 2, wherein said device insulating layer is provided with a top plane, and said top plane, said first recess, said second recess and said top plane are in order between two said fins.

4. The method of manufacturing a semiconductor structure of claim 1, wherein said first region and said second region are n-type channel region and p-type channel region respectively, and said n-type channel region comprises multiple p-type doped said fins and said p-type channel region comprises multiple n-type doped said fins.

5. The method of manufacturing a semiconductor structure of claim 4, wherein said device insulating layer is between adjacent one said p-type doped fin and one said n-type doped fin.

6. The method of manufacturing a semiconductor structure of claim 1, further comprising forming epitaxial structures respectively in said trenches on said n-type doped fins and said p-type doped fins.

7. The method of manufacturing a semiconductor structure of claim 6, wherein said device insulating layer is between adjacent one said epitaxial structure formed on said n-type doped fin and one said epitaxial structure formed on said p-type doped fin.

8. The method of manufacturing a semiconductor structure of claim 6, wherein a material of said epitaxial structure formed on said n-type doped fin is silicon phosphide (SiP), and a material of said epitaxial structure formed on said p-type doped fin is silicon-germanium (SiGe).

9. The method of manufacturing a semiconductor structure of claim 6, further comprising a capping layer formed on said epitaxial structure on said n-type doped fin, wherein said capping layer seals an opening between said epitaxial structures on adjacent said n-type doped fins.

* * * * *